United States Patent [19]

Sampsell

[11] Patent Number: 5,610,625
[45] Date of Patent: Mar. 11, 1997

[54] MONOLITHIC SPATIAL LIGHT MODULATOR AND MEMORY PACKAGE

[75] Inventor: Jeffrey B. Sampsell, Plano, Tex.

[73] Assignee: Texas Instruments Incorporated, Dallas, Tex.

[21] Appl. No.: 481,789

[22] Filed: Jun. 7, 1995

Related U.S. Application Data

[62] Division of Ser. No. 886,077, May 2, 1992, abandoned.

[51] Int. Cl.⁶ .................................................... G09G 3/34
[52] U.S. Cl. .................................. 345/84; 349/155
[58] Field of Search .................. 359/81, 82, 83, 359/84, 85, 80, 62; 345/84, 85, 87, 98, 100, 109, 905, 1, 54; 437/183, 209, 213, 243, 18, 19; 361/793; 257/778; 371/22.1

[56] References Cited

U.S. PATENT DOCUMENTS

| | | | |
|---|---|---|---|
| 4,271,410 | 6/1981 | Crawford | 345/54 |
| 4,346,124 | 8/1982 | Wood et al. | 437/243 |
| 4,368,467 | 1/1983 | Unotoro et al. | 345/98 |
| 4,409,724 | 10/1983 | Taseh, Jr. et al. | 437/19 |
| 4,638,309 | 1/1987 | Ott | 340/752 |
| 4,652,977 | 3/1987 | Jones | 361/793 |
| 4,689,300 | 8/1987 | Kubo et al. | 340/765 |
| 4,694,347 | 9/1987 | Ito | 358/236 |
| 4,736,137 | 5/1988 | Ohwada et al. | 315/169 |
| 4,772,100 | 9/1988 | Suenaga | 359/83 |
| 4,842,377 | 6/1989 | Nakanowatari | 359/81 |
| 4,963,001 | 10/1990 | Miyajima | 359/83 |
| 5,010,325 | 4/1991 | Ziuchkovski | 340/781 |
| 5,065,227 | 11/1991 | Frankeny et al. | 257/778 |
| 5,117,300 | 5/1992 | Wiemer | 359/88 |
| 5,148,301 | 9/1992 | Sawatsubashi et al. | 359/80 |
| 5,150,109 | 9/1992 | Berry | 340/811 |
| 5,159,598 | 10/1992 | Welles, II et al. | 371/22.1 |
| 5,225,821 | 7/1993 | Sato | 340/784 |

FOREIGN PATENT DOCUMENTS 0385705  9/1990  European Pat. Off.  .......... G09F 9/37

OTHER PUBLICATIONS

Patent Abstracts of Japan, vol. 13, No. 210 (P–872) 17 May 1989 & JP–A–10 28 618 (Seiko Epson Co.)31 Jan. 1989 *abstract*.

Proceedings of the SID; vol. 25, No. 2, 1984, LA, Calif./US pp. 105–115 RR Shiffman et al. An Electrophoretic image display w/internal NNOS address logic & display drivers.

*Primary Examiner*—Steven Saras
*Attorney, Agent, or Firm*—Charles A. Brill; James C. Kesterson; Richard L. Donaldson

[57] ABSTRACT

A modulator package with memory mounted adjacent the modulator allowing operation at two different data rates. The first rate is a steady-state data rate that requires a minimal number of wires from processor to array. The second rate is made possible by a memory buffer with different input and output rates and the ability to have a relatively high pin count. The second rate is the burst data rate which is the time it takes the modulator to update for new data.

14 Claims, 1 Drawing Sheet

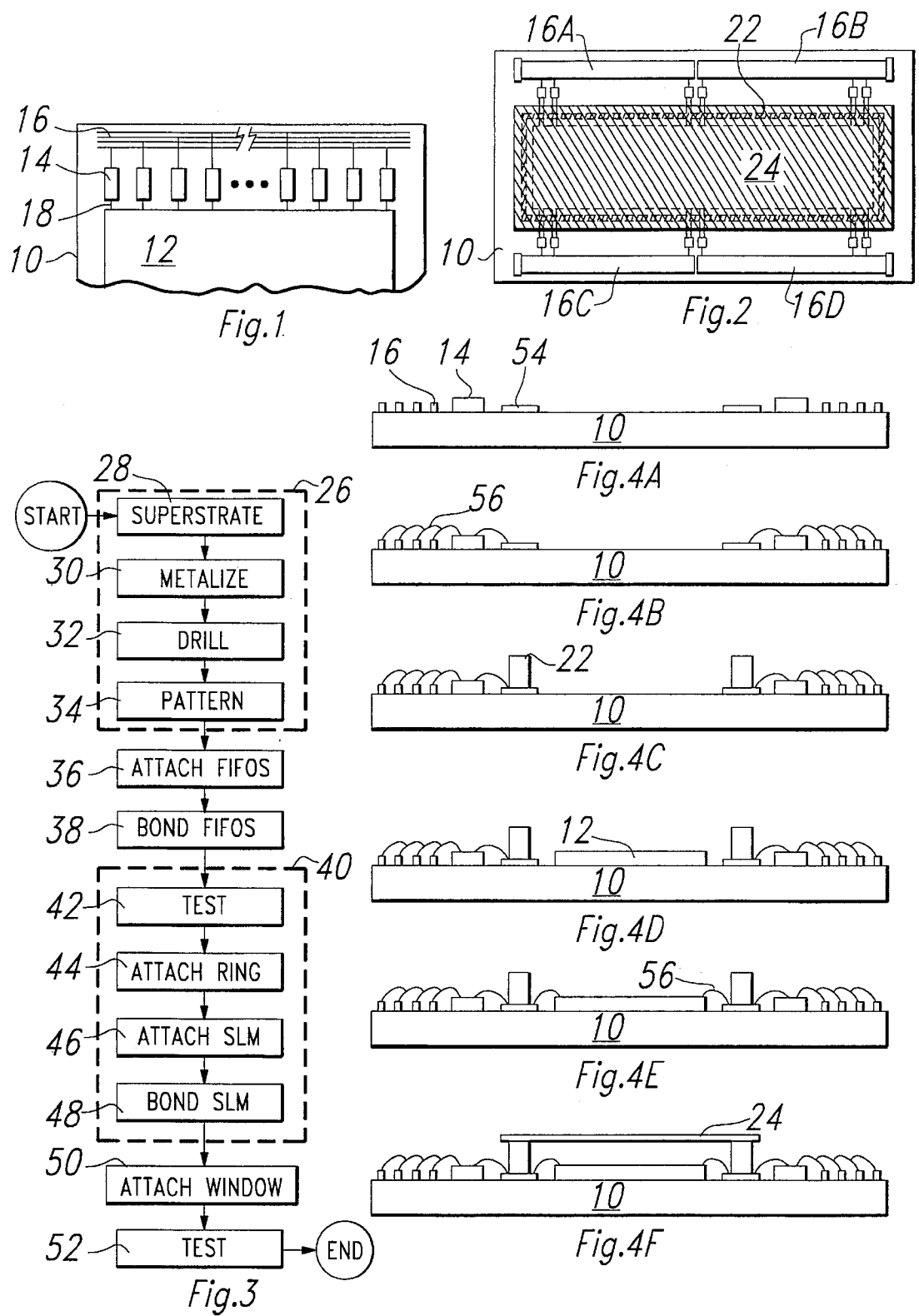

MONOLITHIC SPATIAL LIGHT MODULATOR AND MEMORY PACKAGE

This is a divisional of application Ser. No. 08/886,077, filed May 2, 1992 now abandoned.

BACKGROUND OF THE INVENTION

1. Field of the Invention

This invention relates to spatial light modulators, more particularly to their memory and timing requirements.

2. Background of the Invention

The use of spatial light modulators results in desirable gains in speed, cost and control in systems used in fields such as printing, and high definition television. A spatial light modulator normally consists of an array of cells, preferably individually controllable. Each cell has an electrode or some sort of addressing node that allows that cell to be turned OFF and ON. Typically, a cell that is ON directs the light towards a surface, either through transmission or reflection. In this manner, each dot on a resultant picture, print surface, or even film, can be controlled by the system users.

A problem exists in the data and time requirement for such an array. In high definition television, for example, an array of pixels 2048 wide by 1024 long would not be unusual. Such an array of pixels would require over 2 million data points to be transferred every time the array was updated with new information. In order for the image to be produced from a single array to be in color, a typical 3-color scheme of red, green, and blue would require that the array be updated three times for every frame of information.

To illustrate this point, assume that one-third (one color) of a frame is 5.56 milliseconds ($5.56 \times 10^3$ seconds). The steady-state data rate for 2 million pixels with 8 bits of each color would then be $(2,000,000 \times 8)/0.00556$ which equals approximately $2.8 \times 10^9$, or 2.8 Gigahertz. The burst data rate, which is the highest rate at which data would be delivered to the modulator, takes into account the frame refresh rate for the pixel array. The fastest framing modulator is probably the digital micromirror device (DMD), which offers the worst-case scenario for update times. Assuming a 60 μsecond refresh rate for this device, the burst data rate is $2,000,000/0.00006$, equaling 30 Gigahertz.

The problem with these data rates comes at the transfer of data. To handle a 30 Gigahertz data rate with a reasonable signal transmission speed, 25 Megahertz, for example, the resulting number of wires is $30 \times 10^9 / 25 \times 10^6$, or 1200 wires. Transmitting data along 1200 wires from a remote processor to a spatial light modulator would be inefficient and costly. Obviously, a way to eliminate this problem is desired.

SUMMARY OF THE INVENTION

The present invention disclosed herein comprises a package for a spatial light modulator array, and method of packaging a spatial light modulator, allowing efficient, effective communications between the modulator and the processor driving it. Memory circuits are mounted adjacent to the modulator that allow more lines of data to support the modulator without the noise and interference that existed previously. This allows the modulator to operate with more exact data, eliminates problems with large cables, and reduces system size and parts count.

BRIEF DESCRIPTION OF THE DRAWINGS

For a more complete understanding of the present invention and for further advantages thereof, reference is now made to the following Detailed Description taken in conjunction with the accompanying Drawings in which:

FIG. 1 shows a schematic of a data handling scheme.

FIG. 2 shows a schematic of a spatial light modulator package.

FIG. 3 illustrates one embodiment of a packaging process.

FIGS. 4A–4F show the modulator as it is moved through the steps of a packaging process.

DETAILED DESCRIPTION OF THE PREFERRED EMBODIMENTS

Spatial light modulators typically do not have incredibly high switching speeds, but the advent of such modulators has begun. The digital micromirror, for example, has an switching time of 10 μseconds. Using 10 μseconds ON and 10 OFF, 50–60 μsecond frame times can be achieved with high efficiencies for very high resolution modulators. This invention offers greatest benefits to such modulators with high data rate demand, but that is not to say that slower switching modulators cannot benefit from the methods and structures described below. Additionally, both reflective modulators that receive and then reflect the light, such as digital micromirrors, and transmissive modulators, such as liquid crystal devices, can benefit from the methods and structures below.

In order to find the optimal number of pins on the modulator addressing inputs and the optimal number of wires in the cable, both the burst data rate of a system, and its steady data rate are used. If, as previously discussed, the frame time is 16.67 milliseconds, and the system is three-color, the time for each color is 5.56 milliseconds. Using an array of 2,000,000 pixels as an example, the steady state data rate is $2,000,000/0.0056$, which is about 2.8 Gigabits per second (Gbps). If the maximum rate over an off-chip wire is 25 Megabits per second (Mbps), the resulting number of wires is ($2.8 \times 10^9$ bits per second)/($25 \times 10^6$ bits per second), which equals about 110 lines on a cable. Adapting this to the next-largest binary number, the cable will end up at 128 lines wide. Of course, these numbers are used only as an illustration.

The problem lies in the burst data rate. Even if the designer desired, running the maximum data rate across 128 lines would result in ($30 \times 10^9/128$), 235 Mbps per line. Obviously, this is not currently reasonable for conventional commercial interconnects. However, if the steady-state data rate could be decoupled from the burst data rate, the system becomes much more practical.

The first-in-first-out (FIFO) offers such a decoupling, as do many other types of memories, such as video random access memory (VRAM). FIFOs can be filled at one data rate while being emptied at another. Additionally, the FIFOs come with data paths of varying sizes. Also a possibility is a custom memory circuit, designed specifically for that modulator. An example of such a system is shown schematically in FIG. 1.

A superstrate 10 holds the modulator array 12 with its associated addressing circuitry (not shown), and an array of FIFOs 14. A bus 16 passes data to the FIFOs. In the above scheme the bus would be 128 lines wide. In order to handle the burst data rate, the 2048 columns are grouped together. The size of the groups depends upon the width of the FIFOs chosen, and the tolerance for the output on the FIFOs to handle the data rate. If 16-bit FIFOs were chosen, for example, the pins required would be 2048/16 or 128.

In order to find out the data rate these would have to handle, the burst data rate is divided by the number of pins, 30 Gbps/128=235 Mbps. Since 128 pins is obviously unsatisfactory by an order of about 4, the calculation is attempted again, 30 Gbps/512 pins=58 Mbps. This is a difficult number to achieve for chip-to-chip interconnections on a printed circuit boards, but since the buffers are directly upon the same superstrate with the cells, it is possible. If the data path of FIFO 14 were 8 bits wide, in the schematic of FIG. 1, there would have to be 512/8, or 64 FIFO buffers to load the modulator array. The FIFOs are loaded at the steady-state rate of 2.8 Gbps, but during 8 bursts in each 5.56 milliseconds they are emptied at the burst data rate of 30 Gbps.

The above discussion now gives a basis for a more realistic implementation of such an architecture. Placing the modulator loading memories on the substrate allows the data rates to be manageable, as discussed previously, but the package as discussed schematically is not. FIG. 2 shows a more realistic embodiment of a modulator package with the memories on board.

In FIG. 2, the modulator array is addressed from both the top and the bottom. This allows the data lines to be divided up into more manageable bus sizes. In this embodiment, the busses have further been split up from side to side. The superstrate 10 then holds four busses, 16A for the top left side of the device, through 16D, for the bottom right side of the device. They are connected to the off-chip processor by connectors 20A–20D. Each bus in this scheme is then 32-bits wide. The FIFO arrays 14A–14D, consist of 16 FIFOs each, totalling 64 in all. Each FIFO, then, receives data from eight lines of the bus, four 8-bit FIFO's per word.

Additionally on the superstrate, is a ring 22, which allows the window 24 to be held away from the array while allowing light to pass through it, and simultaneously protects the modulator from contaminants. This package allows the modulator to be used with a minimal number of wires between it and the processor, yet maintains the proper communication data rates, and allows for extremely high burst data rates.

The process of building this package is detailed in FIGS. 3 and 4. FIG. 3 shows the steps of the process, and FIG. 4 shows the superstrate at various points in the process. Looking now at FIG. 3, the superstrate is prepared in step 28. For ruggedization and stability, ceramic is a suitable superstrate for packages such as this. In one embodiment the superstrate is then metalized for bus lines and the bond pads in step 30. Holes are then drilled for connectors in step 32. The metal is then patterned to define the bus lines and bond pads. All of the steps within box 26 may be switched around. This is dependent upon the designers requirements as well as the materials used.

Step 36 requires the mounting of the FIFOs. The chips could be attached in surface mount packages, but this method consumes considerable superstrate area. For minimum space, only the die of the chips alone could be used. These could be tab mounted or bonded individually to the superstrate. The bonding could be achieved by adhesive or by reflow-soldering. The superstrate at this point can be seen in FIG. 4A. The bond pads 54, FIFOs 14, and bus lines 16 all lie upon the superstrate 10. In FIG. 3, step 38, the FIFOs are bonded by wires (56 in FIG. 4B) to the bond pads.

Steps 42, 44, 46 and 48 may be switched, as indicated by box 40, depending upon the equipment used. The superstrate must be tested, possibly before the mounting ring is attached. Removing bad FIFOs or rebonding wires may be easier before the ring is attached. Yet, attaching the ring may cement a loose connection, allowing the superstrate to pass the test. If testing is done first, it may be desirable to die mount and bond the modulator before mounting the ring.

FIG. 4C shows the ring 22 being attached before the modulator is mounted and bonded. In FIG. 4D, the modulator 12 has been attached, and bonded with wires 56 in FIG. 4E. Referring back to FIG. 3, the window is added in step 50 and the entire package is tested in step 52. The resulting package is in FIG. 4F.

This packaging scheme allows the modulator to operate easily at relatively high data burst rates without an inordinate amount of wires from processor to modulator.

Thus, although there has been described to this point particular embodiments of a monolithic spatial light modulator package, and method of packaging it is not intended that such specific references be considered as limitations upon the scope of this invention except in-so-far as set forth in the following claims.

What is claimed is:

1. A digital micromirror device package comprising:
   a. a superstrate;
   b. at least one data bus on said superstrate;
   c. at least one connector on said superstrate electrically connected to said bus;
   d. at least one buffer memory on said superstrate connected to said bus operable to receive data at a first rate from said bus, said buffer memory selected from the group consisting of first-in-first-out memories and video random access memories;
   e. a digital micromirror device on said superstrate with addressing circuitry electrically connected to receive data at a second rate from said buffer memories;
   f. a ring on said superstrate around said digital micromirror device; and
   g. a window on said ring to allow light to pass through from said digital micromirror device, said window spaced apart from said digital micromirror device by said ring, wherein said ring completely surrounds said digital micromirror device and protects said digital micromirror device from contaminants.

2. The package of claim 1 wherein said superstrate is ceramic.

3. The package of claim 1 wherein said ring separates said buffer memory from said digital micromirror device.

4. A method of packaging a digital micromirror device comprising:
   a. providing a superstrate;
   b. producing bus lines and bond pads on said superstrate;
   c. attaching buffer memories to said superstrate, said buffer memories selected from the group consisting of first-in-first-out memories and video random access memories;
   d. electrically connecting said butter memories to said bond pads;
   e. attaching a digital micromirror device to said superstrate;
   f. attaching a ring to said superstrate, said ring surrounding said digital micromirror device;
   g. electrically connecting said digital micromirror device to said bond pads; and
   h. covering at least a portion of the superstrate with a window, said window being spaced from said digital micromirror device by said ring, wherein said superstate, said ring, and said window prevent contaminants from reaching said digital micromirror device.

5. The method of claim 4 wherein said attaching buffer memories step comprises gluing down said buffer memories.

6. The method of claim 4 wherein said step of electrically connecting said buffer memories comprises connecting wires from said buffer memory to said bond pad.

7. The method of claim 4 wherein said attaching a digital micromirror device step comprises gluing down said digital micromirror device.

8. The method of claim 4 wherein said electrically connecting said digital micromirror device comprises connecting wires from said digital micromirror device to said bond pads.

9. The method of claim 4 wherein said attaching a ring step is comprised of attaching a ring to said superstrate between said digital micromirror device and said buffer memories.

10. A digital micromirror device package comprising:

a superstrate;

at least one bond pad formed on said superstrate, said bond pad having a first end, a second end, and a middle portion between said first and second ends;

a ring supported by said superstrate and defining an enclosing a portion of said superstrate, wherein said first portion of said at least one bond pad is on said enclosed portion, and said second portion of said at least one bond pad is not on said enclosed portion;

a digital micromirror device supported by said enclosed portion of said superstrate; and a window supported over and apart from said digital micromirror device by said ring, wherein said window, said ring, and said superstrate enclose said digital micromirror device.

11. The package of claim 10 further comprising bond wires attached to said digital micromirror device and said first portion of said at least one bond pad.

12. The package of claim 10 further comprising bond wires attached to said second portion of said at least one bond pad.

13. The package of claim 10 further comprising a buffer memory supported by said superstrate, said buffer memory selected from the group consisting of first-in-first-out memories and video random access memories.

14. The package of claim 10 wherein said ring separates said digital micromirror device from said buffer memories.

* * * * *